(12) United States Patent
Seeman

(10) Patent No.: US 6,955,066 B2
(45) Date of Patent: Oct. 18, 2005

(54) METHOD AND SYSTEM FOR COATING A GLASS CONTACTING SURFACE WITH A THERMAL BARRIER AND LUBRICOUS COATING

(76) Inventor: Thomas A. Seeman, 293 Bates Rd., Perrysburg, OH (US) 43551

( * ) Notice: Subject to any disclaimer, the term of this patent is extended or adjusted under 35 U.S.C. 154(b) by 137 days.

(21) Appl. No.: 10/383,164

(22) Filed: Mar. 6, 2003

(65) Prior Publication Data

US 2003/0175424 A1 Sep. 18, 2003

Related U.S. Application Data

(63) Continuation-in-part of application No. 09/847,634, filed on May 2, 2001, now Pat. No. 6,840,060.

(51) Int. Cl.[7] ............................................. C03B 40/00
(52) U.S. Cl. ..................................... 65/169; 431/348
(58) Field of Search ........................... 65/169; 431/346

(56) References Cited

U.S. PATENT DOCUMENTS

| 3,015,449 A | * | 1/1962 | Meyer ........................ 239/417 |
| 3,266,731 A | * | 8/1966 | Lankford .................... 239/408 |
| 3,377,389 A | | 4/1968 | Griesbaum |
| 3,455,514 A | | 7/1969 | Fenley |
| 3,750,958 A | * | 8/1973 | Hasselmann ............. 239/419.3 |
| 4,060,371 A | * | 11/1977 | Gentry et al. ................. 431/75 |
| 4,333,756 A | | 6/1982 | Seeman |
| 4,431,400 A | * | 2/1984 | Kobayashi et al. ............ 431/6 |
| 4,498,918 A | | 2/1985 | Seeman |
| 4,572,483 A | * | 2/1986 | Leu ............................ 266/48 |
| RE34,785 E | | 11/1994 | Virey |
| 5,489,759 A | * | 2/1996 | Litt et al. .............. 219/124.34 |
| 5,679,409 A | | 10/1997 | Seeman |
| 5,746,800 A | | 5/1998 | Ambrogio |
| 5,888,266 A | | 3/1999 | Eagle et al. |
| 6,068,889 A | | 5/2000 | Seeman |
| 6,213,761 B1 | * | 4/2001 | Schmidt ..................... 431/328 |
| 2003/0221455 A1 | * | 12/2003 | Scott et al. .................... 65/26 |

FOREIGN PATENT DOCUMENTS

JP 03-153509 1/1991

* cited by examiner

*Primary Examiner*—Sean Vincent
(74) *Attorney, Agent, or Firm*—Irving M. Weiner; Pamela S. Burt; Weiner & Burt, P.C.

(57) ABSTRACT

A method and system for coating a glass contacting surface with a thermal barrier and lubricious coating. The system uses a novel exterior surface mixing tip device wherein oxygen is supplied through a predetermined portion of one supply line, and a predetermined gas is supplied through a predetermined portion of another supply line enveloping the first predetermined portion.

12 Claims, 3 Drawing Sheets

METHOD AND SYSTEM FOR COATING A GLASS CONTACTING SURFACE WITH A THERMAL BARRIER AND LUBRICOUS COATING

The present patent application is a continuation-in-part of U.S. patent application Ser. No. 09/847,634 filed May 2, 2001, now U.S. Pat. No. 6,840,060 which is incorporated herein by reference thereto.

FIELD OF THE INVENTION

The present invention relates generally to a method and system for coating a glass contacting surface with a thermal barrier and lubricous coating.

More particularly, the present invention relates to a method and system for instantly coating a glass contacting surface, such as an H-28, IS- or TV-machine mold, with a dense thermal barrier carbon coating by several means, including, but not limited to, varying the mixtures of the combusted gases, the manner of supplying said gases to a novel exterior surface mixing tip device, and selectively and movably positioning said exterior surface tip device relative to the glass contacting surface.

BACKGROUND OF THE INVENTION

Glass contacting surfaces of glass forming equipment must be lubricated to prevent the glass from sticking to the glass contacting surfaces. The methods, techniques and equipment used to date to accomplish this have proved inadequate.

The prior art is exemplified by the following United States patents: Griesbaum U.S. Pat. No. 3,377,389; Fenley, Jr. U.S. Pat. No. 3,455,514; Seeman U.S. Pat. No. 4,333,756; Seeman U.S. Pat. No. 4,498,918; Seeman U.S. Pat. No. 5,679,409; Ambrogio U.S. Pat. No. 5,746,800; Eagle U.S. Pat. No. 5,888,266; Seeman U.S. Pat. No. 6,068,889; and Virey U.S. Reissue Pat. No. 34,785.

It is a desideratum of the present invention to avoid the animadversions of the prior art and conventional techniques, methods and systems.

SUMMARY OF THE INVENTION

The term "predetermined gas" as used herein means a gas comprising one or more of: propylene; and/or a stabilized combination of liquified petroleum gas with methylacetylene-propadiene.

The present invention provides a method of instantly coating a glass contacting surface with a dense thermal barrier carbon coating, said method comprising the steps of: placing at least one predetermined portion of a a first gas supply line within and separated from at least a predetermined portion of a second gas supply line; directing a predetermined amount of oxygen through one of said gas supply lines to an external burning point; directing a predetermined amount of a predetermined gas through the other one of said gas supply lines to said external burning point; igniting said oxygen and said predetermined gas at said external burning point to form a flame which deposits said dense thermal barrier carbon coating on said glass contacting surface; and controlling the size of said flame by varying a predetermined space between said predetermined portions of said first and second gas supply lines.

The present invention also provides a system for instantly coating a glass making machine mold with a dense thermal barrier carbon coating, comprising, in combination: a glass making machine mold; an exterior surface mixing tip device selectively and movably positionable relative to said glass making machine mold; first gas supply means operably connected to said exterior surface mixing tip device; second gas supply means operably connected to said exterior surface mixing tip device through one of said gas supply means; a predetermined amount of a predetermined gas being supplied to said exterior surface mixing tip device through one of said gas supply means; a predetermined gas being supplied to said exterior surface mixing tip device through the other of said gas supply means; ignitor means positional near the tip of said exterior surface mixing tip device for igniting the gasses thereat; said exterior surface mixing tip device being constructed and arranged so that said oxygen and said predetermined gas mix with each other only at said tip of said exterior surface mixing tip device.

The primary object of the present invention is to provide a method and system to instantly coat a glass making machine mold with a dense thermal carbon coating by varying mixtures of oxygen and said predetermined gas.

Another object of the present invention is to provide such a method and system where all backfire potential is eliminated.

A further object of the present invention is to provide such a method and system wherein there is no premixed gas in the system, but only at the external burning tip.

Yet a further object of the present invention is to provide such a method and system as mentioned hereinabove which provides more latitude in mixing of gases for heat control.

An additional object of the present invention is to provide such a method and system as described hereinabove wherein the oxygen feed is placed on the outside to produce more useable grey carbon.

An additional object of the present invention is to provide such a method and system as described hereinabove wherein greater flame depth is produced by providing the oxygen on the outside.

A further object of the present invention is to provide such a method and system as described hereinabove wherein there is provided an exterior surface burner to ignite the gas.

Yet a further object of the present invention is to provide a method and system as described hereinabove wherein, for difficult placing of the gas, either diagonal or vertical indexing arms may be employed.

Another object of the present invention is to provide such a method and system as described hereinabove wherein there is provided an oxygen line and a separate line for supplying the predetermined gas or mixture of gases, and wherein burning only occurs at the exterior tip of a novel exterior surface mixing tip device.

An additional object of the present invention is to provide such a method and system as described hereinabove wherein carbon is deposited in a period of approximately ½s of a second.

A further object of the present invention is to provide a method and system as described hereinabove which utilizes a vertical or diagonal retractable arm which is timed to index when a glass mold is positioned before the glass gob is dropped, and then the retractable arm is retracted to be positioned out of the path of a gob.

These and other objects and advantages of the present invention will be apparent from the description which follows and the accompanying drawings.

DETAILED DESCRIPTION OF THE INVENTION

Figure 1:
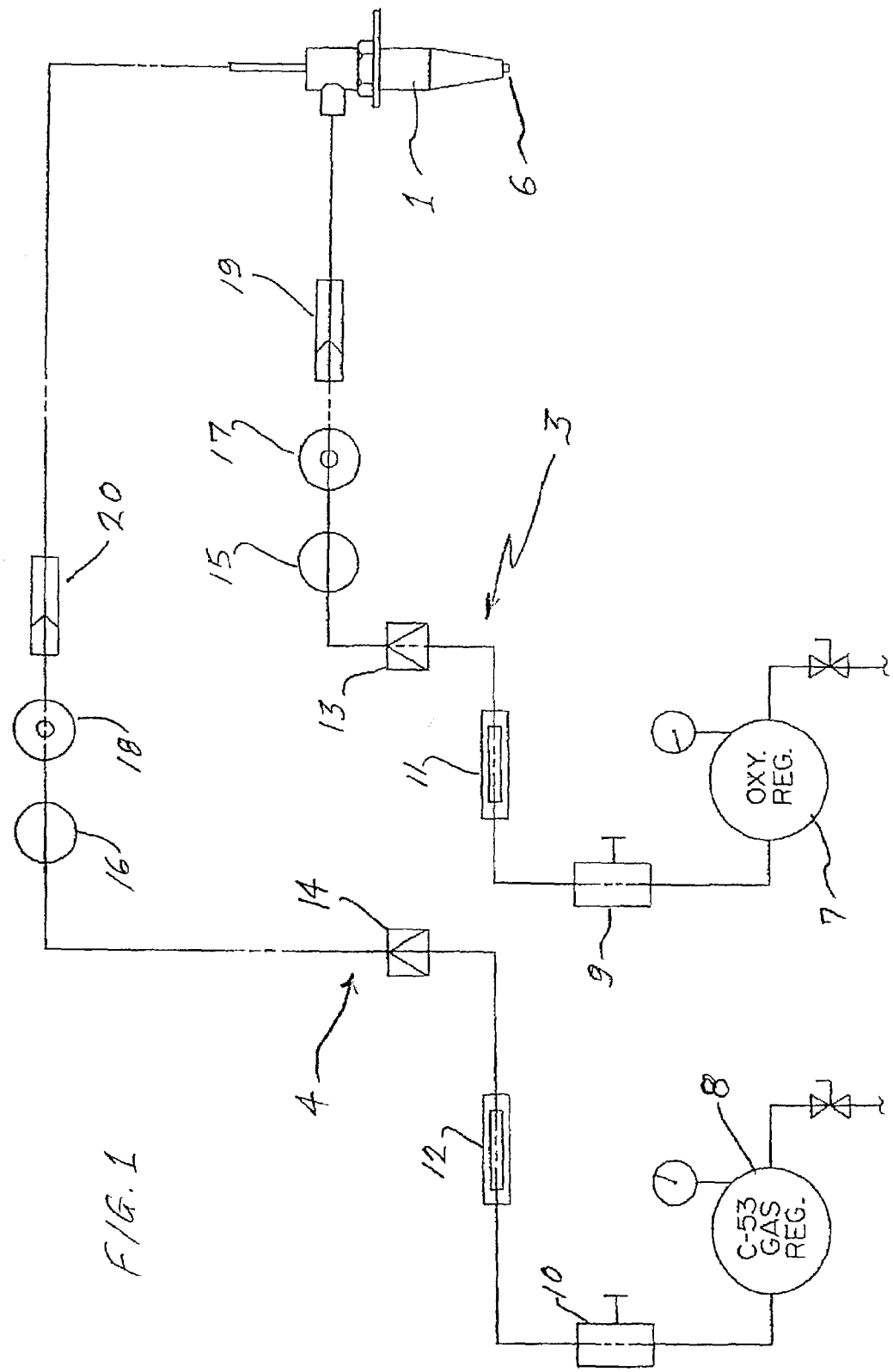
FIG. 1 is a schematic drawing of the exterior surface mixing tip system in accordance with the first embodiment of the present invention.
Figure 2:
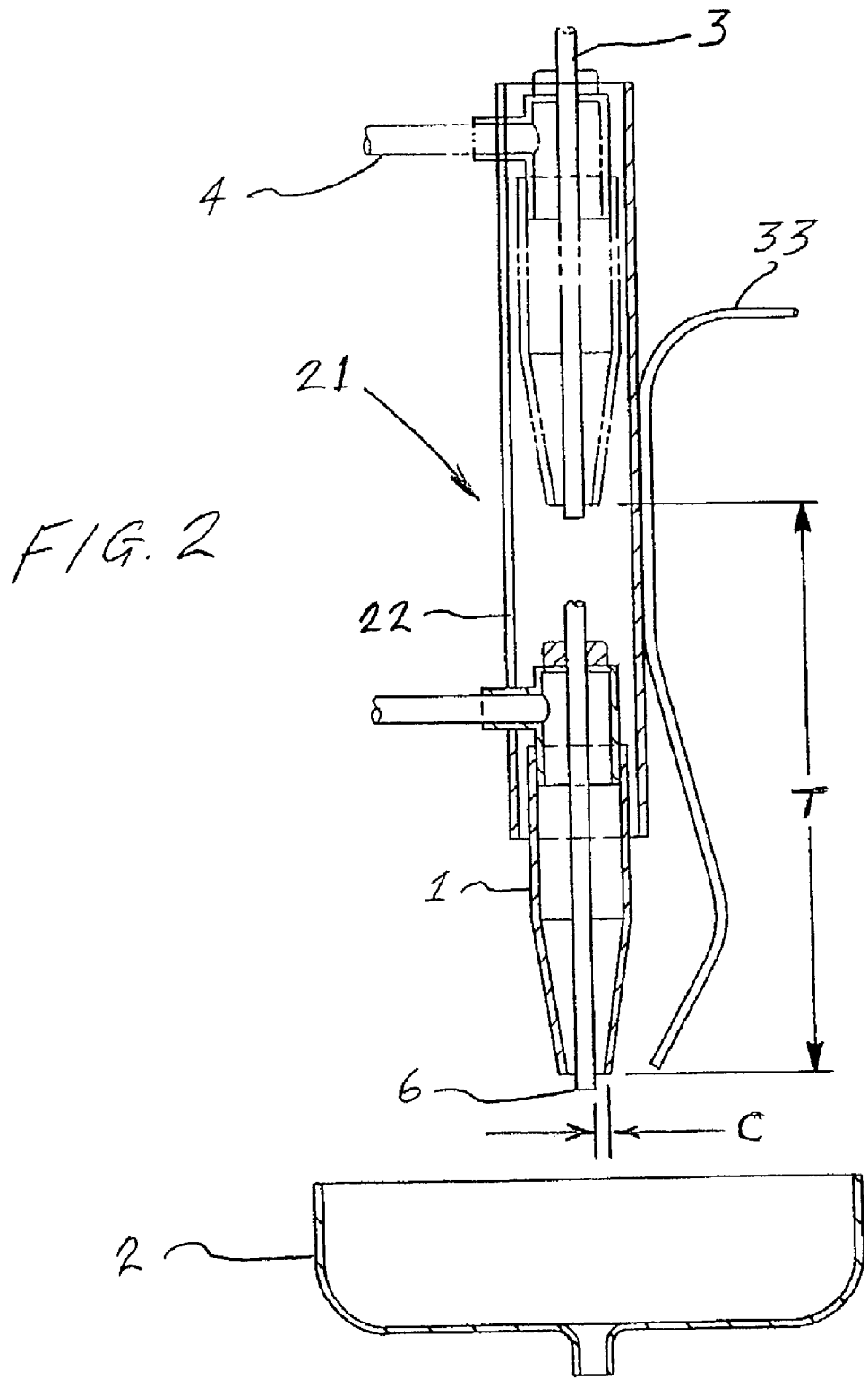
FIG. 2 depicts a schematic view of a vertical indexing arm assembly in accordance with the present invention.

With reference to FIGS. 1 and 2, there is shown a first preferred embodiment in accordance with the present invention.

An exterior surface mixing tip device 1 is provided which is selectively and movably positioned relative to a glass mold 2. A first gas supply means 3 is operatively connected to the exterior surface mixing tip device 1. A second gas supply means 4 is also operatively connected to the exterior surface mixing tip device 1. Oxygen is supplied to the exterior surface mixing tip device 1 through one of the gas supply means 3 or 4. In addition, a predetermined gas is supplied to the exterior surface mixing tip device 1 through the other of the gas supply means 4 or 3, respectively.

There is provided igniter means 5 positioned near the tip of the exterior surface mixing tip device 1 for igniting the gas thereat. The exterior surface mixing tip device 1 is constructed and arranged so that the oxygen and the predetermined gas mix with each other only at the tip 6 of the exterior surface mixing tip device 1.

With particular reference to FIG. 1, there is shown an oxygen regulator 7, a predetermined gas regulator 8, two throttle valves 9 and 10, two 24-volt flow meters 11 and 12, two check valves 13 and 14, two normally-closed control valves 15 and 16, two three-way valves 17 and 18, an oxygen backflash valve 19, and a predetermined gas backflash valve 20.

It should be noted that the three-way valves 17 and 18 may be connected to an optional second exterior surface mixing tip device (not shown).

With reference to FIG. 2, there is shown the vertical indexing arm assembly 21 comprising an air or hydraulic guide tube assembly 22, the exterior surface mixing tip device 1, the oxygen supply line 3, the predetermined gas supply line 4, the glass mold 2, and a pilot light gas line 33.

It should be noted that the exterior surface mixing tip device 1 shown in the upper portion of FIG. 2 is shown in phantom lines to indicate its upper position, as opposed to the lower position of the mixing tip device 1 shown in full lines. The dimension T shown in FIG. 2 is to illustrate the indexing arm length of travel.

Because of air turbulence and the need to deposit carbon in approximately $\frac{1}{25}$ of a second, the indexing arm assembly 21 or 31 is used. Regardless of whether the indexing arm assembly is vertical or diagonal, the retractable indexing arm is timed to index when the mold 2 is positioned before the gob of glass is dropped. The indexing arm then retracts to be positioned out of the path of the gob of glass.

Figure 3:
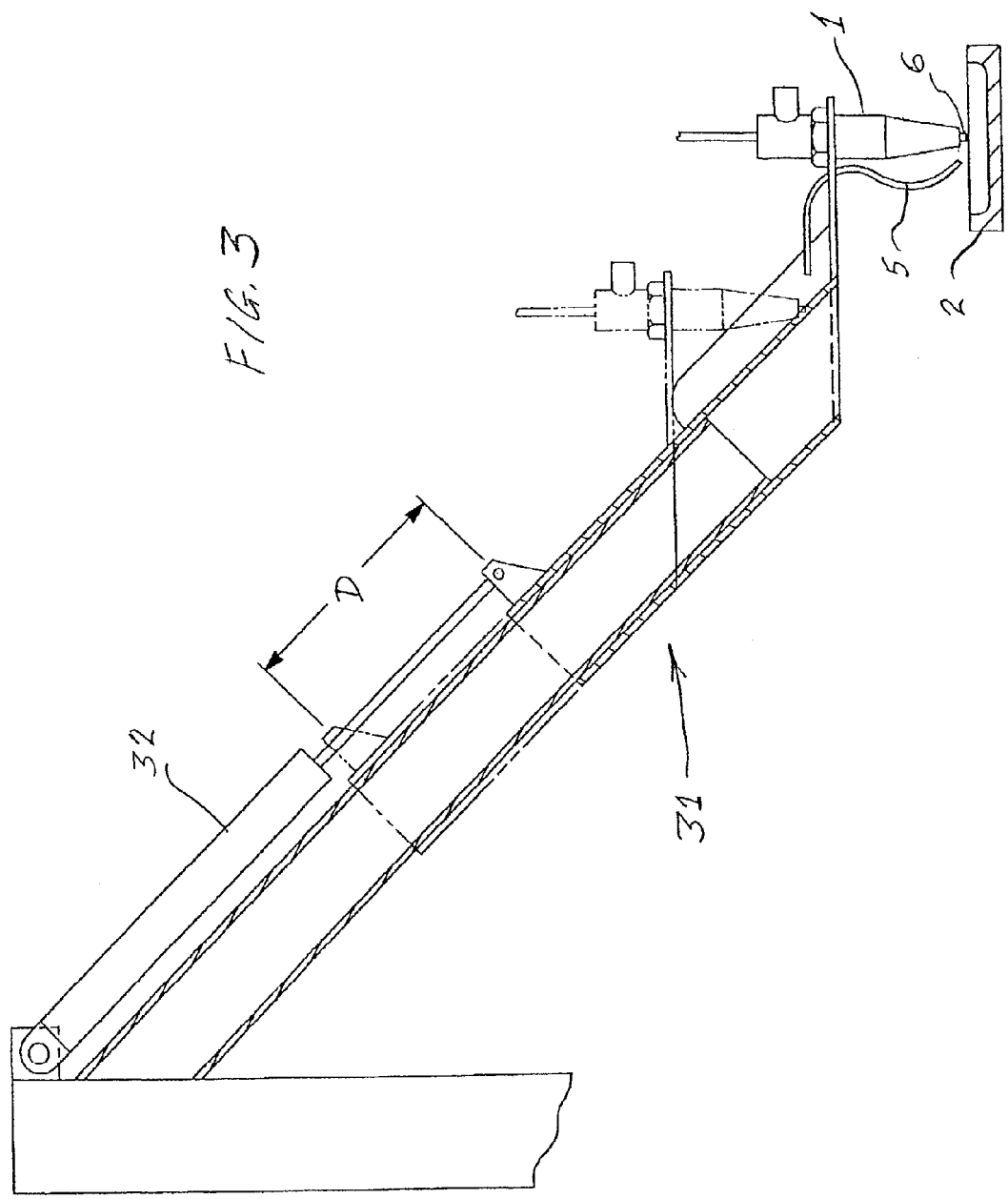
FIG. 3 is a schematic view of a diagonal indexing arm assembly in accordance with the present invention.

FIG. 3 illustrates a diagonal indexing arm assembly 31 in accordance with the present invention.

In FIG. 3 there is shown an exterior surface mixing tip device 1 in phantom in its firing position and in solid line in its position close to the glass mold 2, a pneumatic cylinder 32, and a dimension marked D to indicate the distance of the cylinder travel. There is also shown an igniter 5 close to the tip of the mixing tip device 1.

Preferably, but not necessarily, the inner gas supply line is extended past the tip 6 by 0.065 length. The objective is to reduce turbulence at the surface burner and extend the length of the flame.

In the glass bottle and TV tube production operations, it is necessary to facilitate the deposition of carbon as a thermal barrier and heat control. For this oxygen must be added.

In the limited time of approximately $\frac{1}{25}$ of a second, the addition of oxygen to the predetermined gas produces an abundance of dense carbon. Glass containers and TV molds run at temperatures above approximately 800 degrees Fahrenheit. This necessitates quick carbon coverage to sustain the thermal barrier and lubricity.

With the addition of oxygen to the predetermined gas, the density of the gas is altered. The resulting flame length increases by approximately 40 percent. The diameter of the flame decreases by approximately 40 percent.

In accordance with the present invention, a principal feature involves the incorporation of placing a smaller gas line into a larger oxygen line in the process. The oxygen and the predetermined gas would mix at the exterior tip 6 of the burner. This results in the following advantages.

All backfire potential is eliminated. Oxygen on the outside elongates the flame. Oxygen on the outside produces more gray carbon. Oxygen on the outside uses approximately 10 percent less of said predetermined gas.

Although the predetermined gas ad the oxygen can be interchanged with the predetermined gas on the outside and the oxygen on the inside, it has been found more advantageous to use the oxygen on the outside. Oxygen placed on the inside uses 30 percent more oxygen. The consumption of said predetermined gas increases by 20 percent. The flame temperature of the mixture is less than 1800 degrees K with oxygen on the outside. The flame temperature of the mixture with oxygen on the inside, because of added velocity, is over 1800 degrees K.

In today's high speed production of glass items, such as glass tumblers and glass bottles, the present invention provides a new system for heat control and carbon deposition.

It should be noted that there is no premixed gas in the system. The premixing occurs only at the external burning tip 6.

The flame size can be varied by increasing or reducing the radial space between the oxygen-carrying portion and the predetermined gas-carrying portion. For example, 0.070 inches tolerance between the tubes gives a narrower flame, and 0.095 inches tolerance between the lines would give a wider flame.

The tolerances mentioned hereinabove refer to the radial distance C shown in FIG. 2. The radial distance C is the distance at the flame end of the exterior surface mixing tip device 1 between the outer surface of the first gas supply line 3 and the inner surface of the exterior surface mixing tip device 1.

The present invention provides the following advantageous features: backfire has been eliminated; more latitude in mixing of gases for heat control; placing oxygen feed on the outside, with greater pressure than said predetermined gas supply, has the characteristic to stop the flame from dispersion or flaring, hence this results in the ability to increase the elongation of the total flame; oxygen on the outside produces at least 30 percent more grey poly-acetylene carbon and reduces by 10 percent the charged styrene acetylene; oxygen on the inside tube reduces oxygen consumption by half; greater and quicker heat and carbon control; and increase in the latitude of blending the gases may be increased by 50 percent.

The low pressure regulators 7 and 9 carry metered oxygen and metered predetermined gas, respectively, to the flow meters 11 and 12. To eliminate back pressure in the flow meters 11 and 12 and to sustain a true reading, there is preferably employed sequential synchronized solenoids for firing. The gas tip 6 can be extended approximately 1/16 of an inch to insure no backfire develops.

In accordance with the invention, it is preferred to provide an exterior surface burner to ignite the gas. For difficult placement of the gas, either diagonal or the vertical indexing arm assemblies 31 or 21 can be employed.

Various changes and modifications are possible from the specific disclosure hereof without departing from the spirit and scope of the present invention. The preceding description is not intended to impose any limitation thereon other than those set forth in the following claims.

What is claimed is:

1. A system for instantly coating a glass making machine mold with a dense thermal barrier carbon coating, comprising, in combination:
    a glass making machine mold;
    an exterior surface mixing tip device selectively and movably positionable relative to said glass making machine mold;
    first gas supply means operably connected to said exterior surface mixing tip device;
    second gas supply means operably connected to said exterior surface mixing tip device;
    a predetermined amount of oxygen being supplied to said exterior surface mixing tip device through one of said gas supply means;
    a predetermined amount of a predetermined gas being supplied to said exterior surface mixing tip device through the other of said gas supply means;
    said exterior surface mixing tip device being constructed and arranged so that said oxygen and said predetermined gas mix with each other only at said tip of said exterior surface mixing tip device;
    ignitor means positionable near the tip of said exterior surface mixing tip device for igniting the gasses thereat to form a flame which deposits said dense thermal barrier carbon coating on said glass making machine mold; and
    said igniter means includes an exterior surface burner to ignite said predetermined gas and said oxygen at said tip of said exterior surface mixing tip device.

2. The system according to claim 1, wherein:
    said predetermined gas comprises one or more of: propylene; and/or a stabilized combination of liquefied petroleum gas with methylacetylene-propadiene.

3. The system according to claim 1, wherein:
    said predetermined gas and said oxygen are supplied in a ratio varying from 1:1 to 1:2.

4. The system according to claim 1, wherein:
    a predetermined portion of said first gas supply line comprises an outer portion which is larger than a predetermined portion of said second gas supply line which is internal to a predetermined portion of a said first gas supply line; and
    said predetermined amount of oxygen is supplied through said first gas supply line.

5. The system according to claim 1, including:
    means for selectively and movably positioning said flame by use of a retractable indexing arm.

6. A system for instantly coating a glass contacting surface with a dense thermal barrier carbon coating, comprising, in combination:
    a glass contacting surface;
    an exterior surface mixing tip device selectively and moveably positionable relative to said glass contacting surface;
    a first gas supply means operably connected to said exterior surface mixing tip device for supplying oxygen gas to said exterior surface mixing tip device;
    second gas supply means operably connected to said exterior surface mixing tip device for supplying a predetermined gas to said exterior surface mixing tip device;
    said exterior surface mixing tip device being constructed and arranged so that said oxygen gas and said predetermined gas mix with each other only at said tip of said exterior surface mixing tip device;
    ignitor means positionable near the tip of said exterior surface mixing tip device for igniting said gasses thereat to form a flame which deposits said dense thermal barrier carbon coating on said glass contacting surface;
    said ignitor means includes an exterior surface burner to ignite said predetermined gas and said oxygen gas at said tip of said exterior surface mixing tip device; and
    control means for controlling the coating on said glass surface of said dense thermal barrier carbon coating.

7. The system according to claim 6, wherein:
    said control means includes means for varying the mixtures of said gases.

8. The system according to claim 6, wherein:
    said control means controls the manner of supplying said gases to said exterior surface mixing tip device.

9. The system according to claim 6, wherein:
    said control means controls the selective and moveable positioning of said exterior surface tip device relative to said glass contacting surface.

10. The system according to claim 6, including:
    means for selectively and moveably positioning said flame by use of a retractable indexing arm.

11. The system according to claim 6, including:
    a first predetermined portion of said first gas supply line within and separated from at least a second predetermined portion of said second gas supply line; and
    means for controlling the size of said flame by bearing a predetermined space between said predetermined portions of said first and second gas supply lines.

12. The system according to claim 6, wherein:
    said glass contacting surface comprises a glass making machine mold;
    said control means includes a retractable indexing arm which is timed to index when said mold is positioned just before a gob of molten glass is dropped therein, and said retractable indexing arm then retracts to be positioned out of the path of said gob of glass entering said mold.

* * * * *